United States Patent
Hutton et al.

(10) Patent No.: US 7,312,633 B1
(45) Date of Patent: *Dec. 25, 2007

(54) PROGRAMMABLE ROUTING STRUCTURES PROVIDING SHORTER TIMING DELAYS FOR INPUT/OUTPUT SIGNALS

(75) Inventors: Michael D. Hutton, Mountain View, CA (US); David Lewis, Toronto (CA)

(73) Assignee: Altera Corporation, San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 11/550,218

(22) Filed: Oct. 17, 2006

Related U.S. Application Data

(62) Division of application No. 10/897,770, filed on Jul. 22, 2004, now Pat. No. 7,135,888.

(51) Int. Cl.
*H01L 25/00* (2006.01)
*H03K 19/177* (2006.01)
*H03K 19/173* (2006.01)
*G06F 7/38* (2006.01)

(52) U.S. Cl. ............... 326/41; 326/37; 326/38; 326/39; 326/40; 326/47; 326/101

(58) Field of Classification Search ........... 326/37–41, 326/47
See application file for complete search history.

(56) References Cited

U.S. PATENT DOCUMENTS

| | | | |
|---|---|---|---|
| 5,073,729 A * | 12/1991 | Greene et al. ............ | 326/47 |
| 5,323,069 A * | 6/1994 | Smith, Jr. ................ | 326/47 |
| 5,764,080 A * | 6/1998 | Huang et al. ............ | 326/41 |
| 5,874,834 A * | 2/1999 | New ........................ | 326/39 |
| 5,880,598 A * | 3/1999 | Duong ..................... | 326/41 |
| 6,084,429 A * | 7/2000 | Trimberger ............... | 326/41 |
| 6,094,066 A * | 7/2000 | Mavis ...................... | 326/41 |
| 6,150,837 A * | 11/2000 | Beal et al. ................ | 326/39 |
| 6,285,211 B1* | 9/2001 | Sample et al. ............ | 326/41 |
| 6,348,813 B1* | 2/2002 | Agrawal et al. .......... | 326/41 |

(Continued)

OTHER PUBLICATIONS

"Apex 20K Programmable Logic Device Family." Data Sheet version 2.06 from Altera Corporation San Jose, CA (Mar. 2000).

(Continued)

*Primary Examiner*—Rexford Barnie
*Assistant Examiner*—Dylan White
(74) *Attorney, Agent, or Firm*—Townsend & Townsend & Crew LLP

(57) ABSTRACT

Techniques are provided for routing signals to and from input/output pads on a programmable chip that reduce signal delay times. A programmable routing structure is provided that is dedicated to routing signals to and from the input/output (I/O) pads. The programmable routing structure can include long conductors that transmit signals across the chip quickly without the delay encountered in shorter routing conductors. Signals can be routed to and from the I/O pads through vertical and horizontal dedicated routing conductors that bypass global routing conductors. The dedicated I/O routing structure allows signals to be driven onto the chip and off chip more quickly can be achieved through standard programmable routing structures. The dedicated I/O routing structure can be depopulated to reduce the number of programmable connections between the individual conductors, decreasing die area requirements.

11 Claims, 5 Drawing Sheets

U.S. PATENT DOCUMENTS

| | | | |
|---|---|---|---|
| 6,469,540 B2 * | 10/2002 | Nakaya | 326/41 |
| 6,870,395 B2 * | 3/2005 | Schadt et al. | 326/41 |
| 6,975,137 B1 * | 12/2005 | Schadt et al. | 326/39 |
| 7,000,212 B2 * | 2/2006 | Agrawal et al. | 716/17 |
| 7,132,852 B2 * | 11/2006 | Vest et al. | 326/41 |
| 7,135,888 B1 * | 11/2006 | Hutton et al. | 326/41 |
| 2003/0128051 A1 * | 7/2003 | Cliff et al. | 326/41 |
| 2005/0231236 A1 * | 10/2005 | Vest et al. | 326/41 |

OTHER PUBLICATIONS

"Max 7000 Programmable Logic Device Family," Data Sheet version 6.01 from Altera Corporation San Jose, CA (Jul. 1999).

* cited by examiner

PROGRAMMABLE ROUTING STRUCTURES PROVIDING SHORTER TIMING DELAYS FOR INPUT/OUTPUT SIGNALS

CLAIM OF PRIORITY

This application is a divisional application of U.S. patent application Ser. No. 10/897,770, filed Jul. 22, 2004 now U.S. Pat. No. 7,135,888, entitled "PROGRAMMABLE ROUTING STRUCTURES PROVIDING SHORTER TIMING DELAYS FOR INPUT/OUTPUT SIGNALS," which is hereby incorporated herein by reference.

BACKGROUND OF THE INVENTION

The present invention relates to programmable routing structures that provide fast paths for input/output signals, and more particularly, to a programmable routing structures that reduce delay for signals driven to and from input/outputs pads of an integrated circuit.

Programmable logic integrated circuits (ICs) can be configured to perform a variety of user functions. Programmable logic ICs include programmable logic devices (PLDs), field programmable gate arrays (FPGAs), programmable logic arrays (PLAs), etc. Programmable logic ICs typically have numerous logic blocks (also called logic elements) that can be configured to implement various combinatorial and sequential functions.

The logic blocks have access to a programmable interconnect structure. The programmable interconnect structure can be programmed to interconnect the logic blocks in almost any desired configuration. Logic blocks are often grouped into logic array blocks or macrocells. Programmable logic ICs typically include numerous input and output pads on the die.

A complex programmable logic device (CPLD) is a type of PLD that usually contains non-volatile memory. The MAX 7000 manufactured by Altera Corporation of San Jose, Calif. is an example of a CPLD that contains on-chip non-volatile memory. The MAX 7000 includes a global routing network of vertical interconnects. Each input/output (I/O) pad on the MAX 7000 is connected to the global routing network.

In the MAX 7000, every output signal that is transmitted to an output pad from a macrocell is routed through the global routing network. Every input signal that is received at an input pad is routed to the global routing network before being routed to a macrocell. The global routing network in the MAX 7000 is also used to route signals from one macrocell to another macrocell. Thus, all signals that are transmitted between macrocells and I/O pads are routed through the global routing network.

The MAX 7000 architecture provides roughly the same delay time to transmit a signal from one macrocell to another and between I/O pads and a macrocell. As applications for PLDs have become more complex, customers have continue to demand more logic blocks on each PLD die. However, signal delay times increase by a factor of 4 each time the amount of logic on a chip containing the MAX 7000 architecture is increased by a factor of 2.

CPLDs such as the MAX 7000 typically require short delay times for signals that are routed from pad-to-pad and between pads and registers. Therefore, a need has developed for a routing network on a chip that provides short signal delay times for signals transmitted to and from input and output pads.

BRIEF SUMMARY OF THE INVENTION

The present invention provides techniques for routing signals to and from input/output pads on a programmable chip that reduce signal delay times. Programmable routing conductors are provided that are dedicated to routing signals to and from the input/output (I/O) pads. The programmable routing conductors can include long conductors that transmit signals across the chip quickly without the extra delay caused by routing signals through short conductors.

Signals can be routed to and from the I/O pads through vertical and horizontal dedicated routing conductors that bypass global routing conductors. The dedicated I/O routing conductors of the present invention allow signals to be driven onto the chip and off chip more quickly than can be achieved by standard programmable routing conductors. The dedicated I/O routing conductors can be depopulated to reduce the number of programmable connections between the conductors, decreasing die area requirements.

Other objects, features, and advantages of the present invention will become apparent upon consideration of the following detailed description and the accompanying drawings, in which like reference designations represent like features throughout the figures.

DETAILED DESCRIPTION OF THE INVENTION

Figure 1:
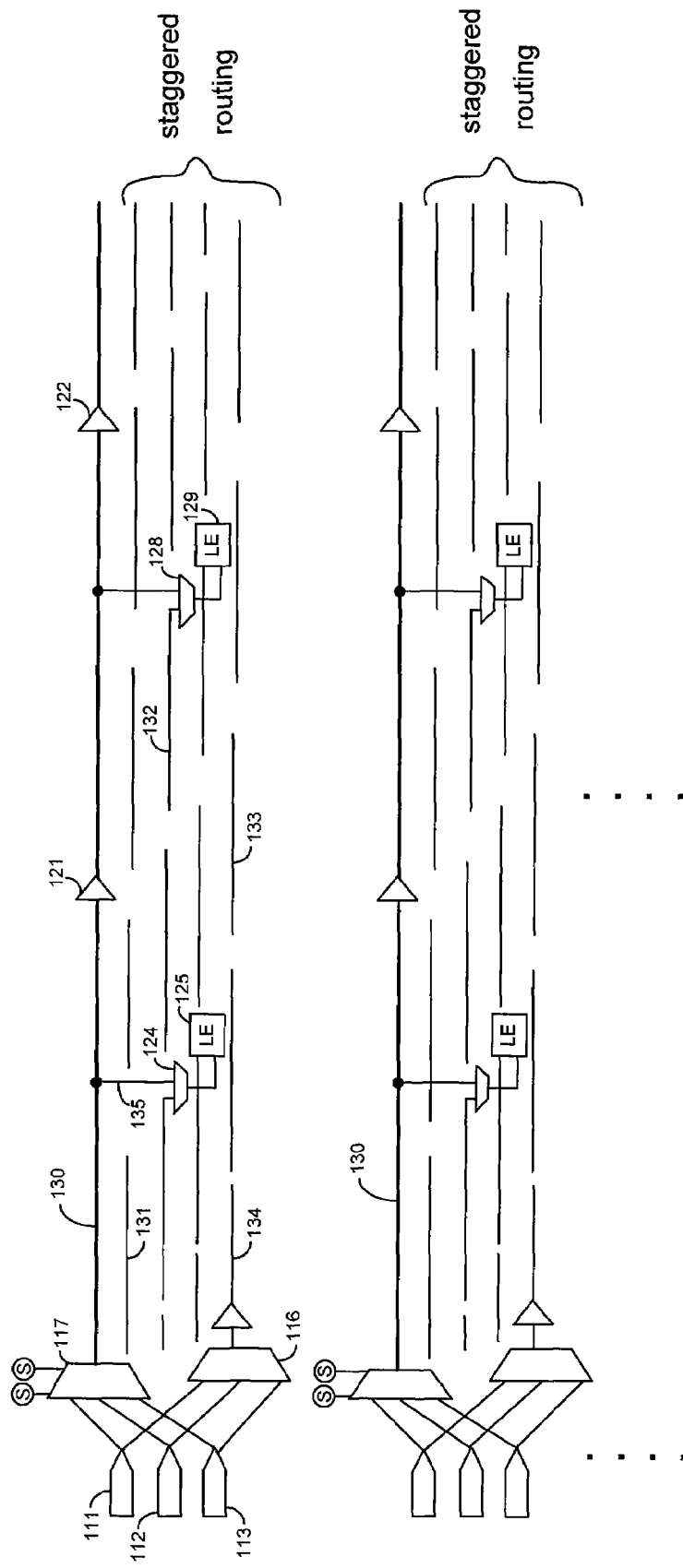
FIG. 1 illustrates a horizontal dedicated I/O routing structure according to a first embodiment of the present invention.

FIG. 1 illustrates a dedicated input routing structure according to a first embodiment of the present invention. Programmable horizontal routing conductors 130 are dedicated for transmitting signals from input pads of a programmable logic integrated circuit (IC). Input pads 111, 112, and 113 are examples of input pads on the IC.

Input signals applied to any of pads 111-113 can be driven to one of routing conductors 130 through 3:1 multiplexer 117. Multiplexer 117 couples conductor 130 to one of pads 111-113 in response to the states of two select signals. The select signals (shown as S in FIG. 1) are stored in memory. Signals driven along line 130 are amplified by buffers 121 and 122. Buffers 121 and 122 (and other buffers) can be inverting or non-inverting buffers.

The programmable logic integrated circuit includes staggered horizontal routing conductors such as conductors 131, 132, 133, and 134 shown in FIG. 1. The staggered routing conductors can include local and segmented conductors. The programmable logic IC also includes segmented and local vertical routing conductors (such as conductor 135) as well as vertical and horizontal global routing conductors (not shown) that are not dedicated to transmitting I/O signals. Examples of global routing conductors are shown and discussed below with respect to FIG. 4. Most of the routing conductors on the IC are coupled to programmable logic connections (PLCs) that can be programmed to connect conductors together.

A programmable logic integrated circuit typically contains numerous programmable logic elements. Only two logic elements are shown in FIG. 1 for simplicity. An input signal on dedicated input conductors 130 can be driven to logic element 125 through conductor 135 and multiplexer 124. A signal on conductor 130 can also be driven to logic element 129 through another vertical conductor and multiplexer 128. Thus, the dedicated input routing structure of the present invention provides fast and direct routing of input signals to logic elements on a programmable logic IC. This feature is particularly important for CPLD chips.

Input signals applied to pads 111-113 can also be coupled to local and segmented routing conductors through 3:1 multiplexer 116. Multiplexer 116 is controlled by two select signals (not shown). The select signals determine which pad is coupled to local routing conductor 134. Thus, input signals applied to input pads of the IC can be driven directly to the dedicated I/O routing conductors 130 or to local routing conductors such as conductor 134.

Figure 2:
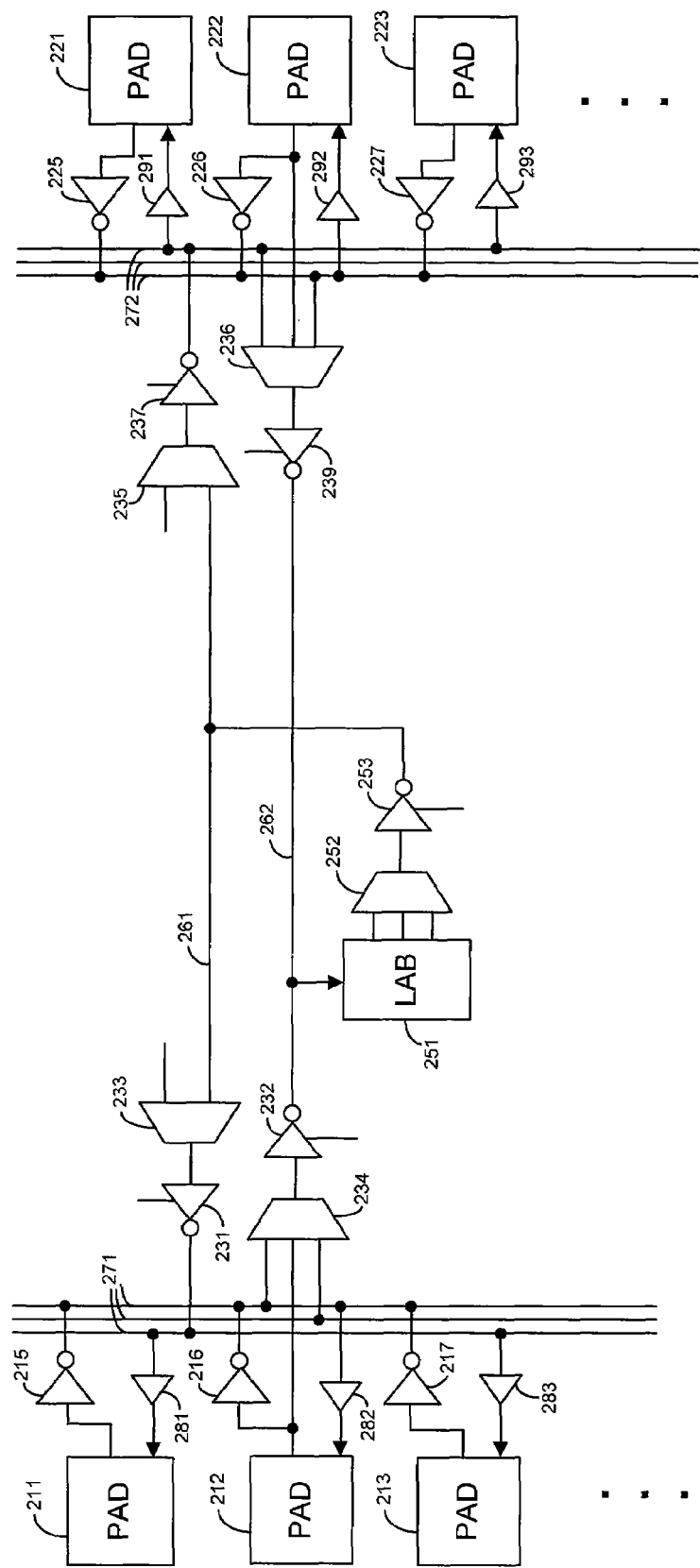
FIG. 2 illustrates a vertical and horizontal dedicated I/O routing structure according to a second embodiment of the present invention.

FIG. 2 illustrates a dedicated I/O routing structure according to a second embodiment of the present invention. FIG. 2 illustrates a portion of a programmable logic IC. The IC includes vertical routing conductors 271-272 and horizontal routing conductors 261-262 that are dedicated for routing signals to and from I/O pads such as pads 211-213 and 221-223. Although a limited number of dedicated I/O routing conductors are shown in FIG. 2, embodiments of the present invention can include any number of vertical and horizontal dedicated I/O routing conductors arranged in any suitable configuration.

Input signals applied to pads 211-213 are driven to dedicated I/O conductors 271 through inverting buffers 215-217, respectively. One of conductors 271 can be programmably coupled to horizontal conductor 262 through multiplexer 234 and tristate driver 232. Also, an input signal applied to pad 212 can be driven directly to conductor 262 through multiplexer 234 without being routed through one of conductors 271.

Input signals applied to pads 221-223 are driven to dedicated I/O conductors 272 through inverting buffers 225-227, respectively. One of conductors 272 can be programmably coupled to horizontal conductor 262 through multiplexer 236 and tristate driver 239. Also, an input signal applied to pad 222 can be driven directly to conductor 262 through multiplexer 236 and tristate driver 239 without being routed through one of conductors 271. Only one signal can be driven to conductor 262 at a time. Tristate drivers 232 and 239 control which set of pads is coupled to conductor 262.

According to an alternative embodiment, inverting buffers 215-217 and 225-227 can be replaced with non-inverting buffers. Inverting buffers are preferred in many applications, because they usually have less delay than non-inverting buffers.

Signals on conductor 262 can be routed directly to logic array block 251, which contains several logic elements. Output signals of LAB 251 can be routed to dedicated I/O horizontal conductor 261 through multiplexer 252 and tristate driver 253. A signal on conductor 261 can be routed through multiplexer 233 and tristate driver 231 to one of dedicated I/O conductors 271. A signal from driver 231 can be applied to I/O pad 211 or 213 by enabling tristate driver 281 or 283, respectively. Output signals can be driven to I/O pad 212 through tristate driver 282 from other dedicated horizontal I/O conductors on the IC that are not shown in FIG. 2.

A signal on conductor 261 can also be driven to one of dedicated I/O conductors 272 through multiplexer 235 and tristate driver 237. A signal from driver 237 can be applied to I/O pad 221 or 223 by enabling tristate drivers 291 or 293, respectively. Output signals can be driven to I/O pad 222 through tristate driver 292 from other dedicated horizontal I/O conductors on the IC that are not shown in FIG. 2. Thus, a signal can be driven directly to an output pad through dedicated I/O conductors of the present invention, greatly decreasing signal delay times. The specific connections between the dedicated I/O conductors and the pads shown in the Figures are just examples that are not intended to limit the scope of the present invention.

The horizontal and vertical dedicated I/O conductors of the present invention can be coupled together through programmable logic connections (PLCs). A PLC can, for example, include a multiplexer that is controlled by a static RAM (SRAM) bit. Preferably, a PLC is not provided at every possible connection between two of the dedicated I/O conductors. A significant amount of die area is required to store large numbers of SRAM bits. Therefore, it is desirable to limit the number of PLCs that interconnect the dedicated I/O conductors.

Selecting only a limited number of locations to interconnect routing conductors using PLCs is referred to as "depopulation." The capability to place and route a wide variety of circuits on a PLD depends upon the availability of routing resources. PLCs need to placed at enough locations to allow flexible routing between I/O pads and the programmable logic.

In the embodiment of FIG. 2, the programmable logic connections (PLCs) between horizontal conductors 261-262 and vertical conductors 271/272 have been depopulated. Conductor 261 can only be connected to one of conductors 271 or one of conductors 272. Only two of conductors 271 have the capability of being connected to conductor 262 through multiplexer 234, and only two of conductors 272 have the capability of being connected to conductor 262 through multiplexer 236. Signals from one of the I/O pads can only be driven to one of conductors 271 or 272. In addition, a signal can be driven to one particular I/O pad from only one of conductors 271 or one of conductors 272.

Depopulation techniques greatly reduce the number of SRAM bits and the number of the PLCs. Each dot in FIG. 2 represents a PLC. FIG. 2 illustrates only one specific example of how dedicated I/O resources of the present invention can be depopulated. One of skill in the art will appreciate that the dedicated I/O resources can be depopulated by limiting the number of PLCs in numerous ways.

In the embodiment shown in FIG. 2, dedicated I/O long conductors 261 and 262 extend the width of the die to provide faster routing of signals to and from the I/O pads than would be provided by shorter segmented conductors that are connected together by numerous PLCs. Vertical dedicated I/O conductors 271 and 272 can extend the length of the die to provide faster routing signals to and from the I/O pad than would be provided by shorter segmented conductors.

A die that incorporates the techniques of the present invention can have any suitable number of vertical and horizontal dedicated I/O conductors. However, the some embodiments of the present invention preferably have a limited number of dedicated I/O conductors. For example, only two horizontal dedicated I/O conductors (261 and 262) are associated with each row of logic array blocks in the embodiment of FIG. 2. As a result, only one pad in each row of LABs can access the fast dedicated I/O conductor 262. Only three vertical dedicated I/O conductors 271/272 are placed along each edge of the die in the embodiment of FIG. 2. Providing a limited number of dedicated I/O long conductors minimizes the impact on die area and chip size.

Figure 3:
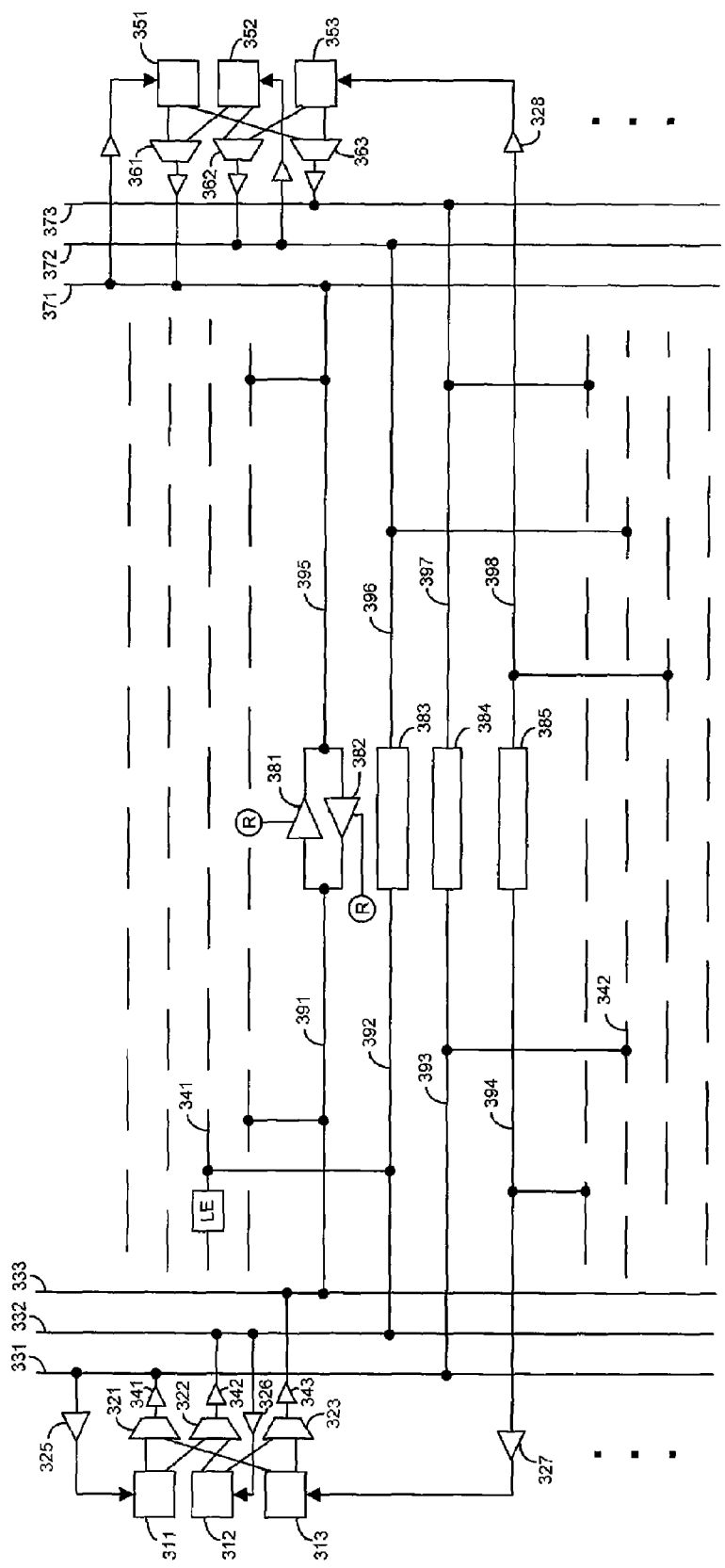
FIG. 3 illustrates another vertical and horizontal dedicated I/O routing structure according to a third embodiment of the present invention.

FIG. 3 illustrates another dedicated I/O routing structure according to a third embodiment of the present invention. The embodiment of FIG. 3 also has a limited number of dedicated I/O conductors. The dedicated I/O routing structure of FIG. 3 includes vertical conductors 331-333 and 371-373 and horizontal conductors 391-398.

Input signals applied to I/O pads 311-313 can be routed to vertical conductors 331-333 as will now be discussed. 2:1 multiplexers 321-323 are controlled by RAM bits that are transmitted to select inputs (not shown) of the multiplexers. Each multiplexer 321-323 has two inputs coupled to two pads and a single output coupled to one of conductors 331-333. Tristate drivers 341-343 are coupled between the output of multiplexers 321-323 and conductors 331-333, respectively.

An input signal applied to a particular I/O pad can be driven to one or two (but not three) of conductors 331-333. For example, an input signal applied to pad 311 can be driven to conductor 331 through multiplexer 321 and/or conductor 332 through multiplexer 322. Input signals on other I/O pads on the die can also be driven to conductors 331-333.

According to an alternative embodiment, three 3:1 multiplexers can couple each of pads 311-313 to all three conductors 331-333. However, each 3:1 multiplexer requires 2 RAM bits coupled to two select inputs, while a 2:1 multiplexer only requires 1 RAM bit coupled to one select input. For this reason, 2:1 multiplexers are preferred for applications that have limited storage space.

Input signals applied to I/O pads 351-353 can be driven to vertical conductors 371-373 through multiplexers 361-363. Specifically, multiplexer 361 can drive signals on pad 351 or pad 352 to conductor 371, multiplexer 362 can drive signals on pad 352 or pad 353 to conductor 372, and multiplexer 363 can drive signals on pad 351 or pad 353 to conductor 373. Tristate drivers are coupled to the outputs of each of the multiplexers. The tristate drivers are enabled and disabled by control signals (not shown).

Vertical conductors 331-333 are programmably coupled to horizontal conductors 391-393 through PLCs. As shown in FIG. 3, each vertical conductor 331-333 is programmably coupled to only one of horizontal conductors 391-393. Vertical conductors 371-373 are programmably coupled to horizontal conductors 395-397 through PLCs. Each vertical conductor 371-373 is programmably coupled to only one of the horizontal conductors 395-397. Thus, the design shown in FIG. 3 does not provide complete interconnection capability between the horizontal and vertical dedicated I/O conductors. This embodiment is another example of how the number of PLCs can be depopulated to reduce memory storage space requirements.

The horizontal conductors 391-398 span about half the width of the die and are coupled to tristate drivers at the center of the die. For example, conductor 391 is coupled to cross coupled tristate drivers 381 and 382, which are each enabled by an SRAM bit. Horizontal conductors 392-394 are coupled to cross coupled tristate drivers in blocks 383-385, respectively. Tristate drivers 381-385 isolate conductors 391-394 from conductors 395-398, respectively.

The programmable logic IC design shown in FIG. 3 also includes numerous shorter horizontal and vertical routing conductors such as conductors 341-342. Horizontal conductors 391-398 can be programmably coupled to the shorter local and segmented routing conductors, as shown in FIG. 3. For example, dedicated I/O conductor 392 is coupled to local horizontal conductor 341 through a vertical conductor. As another example, dedicated I/O conductor 393 is coupled to local horizontal conductor 342 through a vertical conductor.

Dedicated I/O routing resources of the present invention can be programmably coupled to global routing resources. For example, horizontal conductors 391-398 can be coupled to global vertical conductors. However, in general, input and output signals are routed between I/O pads and logic elements more quickly through the dedicated I/O conductors of the present invention, without being routed through the global routing conductors.

Output signals can be driven from logic elements or other circuit elements to horizontal conductors 391-398. Signals on conductors 391-393 can be driven to vertical conductors 333, 332, and 331, respectively. Signals on conductors 395-397 can be driven to vertical conductors 371-373, respectively.

Output signals can be driven from conductors 331-332 to I/O pads 311-312 by enabling tristate drivers 325-326, respectively. Output signal can also be driven from conductors 371-372 to pads 351-352 through tristate drivers. The programmable connections between the vertical dedicated I/O conductors and the conductors that couple to the I/O pads are also depopulated in the FIG. 3 embodiment for the reasons described above.

An output signal can be driven directly from dedicated horizontal conductor 394 to pad 313 through tristate driver 327. An output signal can be driven directly from dedicated horizontal conductor 398 to pad 353 through tristate driver 328.

It should be understood that the architectures shown in the Figures of the present application are examples of the present invention. Any of the features described herein can be combined in numerous ways in addition to the structures shown in the Figures, as would be understood by those of skill in the art. It should also be understood that the dedicated I/O routing conductors can route signals between I/O pads and any type of circuit elements on an IC such as programmable logic elements, registers, and memory cells.

The techniques of the present invention provide routing of signals between I/O pads and circuit elements on an IC through dedicated I/O routing resources. The dedicated I/O resources bypass standard global routing resources to provide a faster and more direct connection between the I/O pads and various on-chip circuit elements. Specifically, the dedicated I/O routing resources reduce the pad-to-register and the register-to-pad delays on an IC. The dedicated I/O conductors of the present invention can be used with any programmable logic IC architecture.

Figure 4:
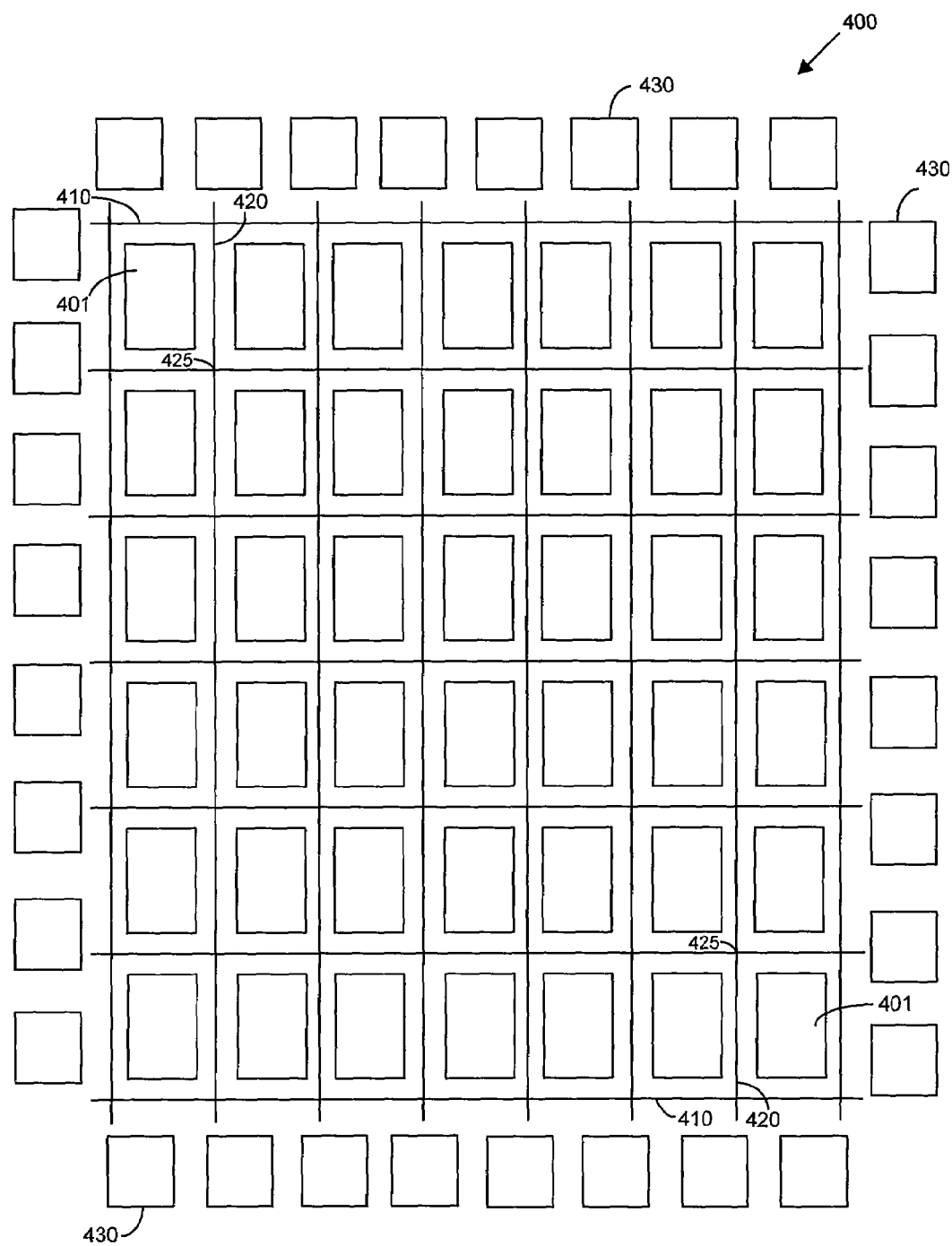
FIG. 4 is a simplified block diagram of a programmable logic device that can be used with the techniques of the present invention.

FIG. 4 is a simplified block diagram of a PLD 400 that can including dedicated I/O routing resources of the present invention. FIG. 4 shows a 7-by-6 two-dimensional array of macrocells or logic array blocks 401. Blocks 401 are referred to as LABs herein for simplicity. LAB 401 is a physically grouped set of logical resources that is configured or programmed to perform logical functions. PLDs may contain any arbitrary number of LABs, more or less than shown in PLD 400 of FIG. 4. Generally, in the future, as technology advances and improves, programmable logic devices with greater numbers of logic array blocks or macrocells will undoubtedly be created. Furthermore, LABs 401 can be organized in a square or rectangular matrix or array of any size; for example, the array may be organized in a five-by-seven or a twenty-by-seventy matrix of LABs.

LAB 401 has inputs and outputs (not shown) which may or may not be programmably connected to a global interconnect structure, comprising an array of global horizontal interconnects (GHs) 410 and global vertical interconnects (GVs) 420. The dedicated I/O routing interconnect structure of the present invention (not shown in FIG. 4) typically bypasses global interconnect structure 410 and 420.

Although shown as single lines in FIG. 4, each GH 410 and GV 420 line may represent a plurality of signal conductors. The inputs and outputs of LAB 401 are programmably connectable to an adjacent GH 410 and an adjacent GV 420. Utilizing GH 410 and GV 420 interconnects, multiple LABs 401 may be connected and combined to implement larger, more complex logic functions than can be realized using a single LAB 401.

In one embodiment, GH 410 and GV 420 conductors may or may not be programmably connectable at intersections 425 of these conductors. Moreover, GH 410 and GV 420 conductors can make multiple connections to other GH 410 and GV 420 conductors. Various GH 410 and GV 420 conductors may be programmably connected together to create a signal path from a LAB 401 at one location on PLD 400 to another LAB 401 at another location on PLD 400.

A signal may pass through a plurality of intersections 425. Furthermore, an output signal from one LAB 401 can be directed into the inputs of one or more LABs 401. Also, using the global interconnect, signals from a LAB 401 can be fed back into the same LAB 401. According to a specific embodiment, only selected GH 410 conductors are programmably connectable to a selection of GV 420 conductors. Furthermore, in still further embodiments, GH 410 and GV 420 conductors may be specifically used for passing signal in a specific direction, such as input or output, but not both.

In other embodiments, the programmable logic integrated circuit may include special or segmented interconnect that is connected to a specific number of LABs and not necessarily an entire row or column of LABs. For example, the segmented interconnect may programmably connect two, three, four, five, or more LABs.

The PLD architecture in FIG. 4 further shows at the peripheries of the chip, input-output drivers 430. Input-output drivers 430 are for interfacing the PLD to external, off-chip circuitry through I/O pads. FIG. 4 shows thirty-two input-output drivers 430; however, a PLD can contain any number of input-output drivers, more or less than the number depicted. Each input-output driver 430 is configurable for use as an input driver, output driver, or bidirectional driver. In other embodiments of a programmable logic integrated circuit, the input-output drivers may be embedded with the integrated circuit core itself. This embedded placement of the input-output drivers may be used with flip chip packaging and will minimize the parasitics of routing the signals to input-output drivers.

Figure 5:
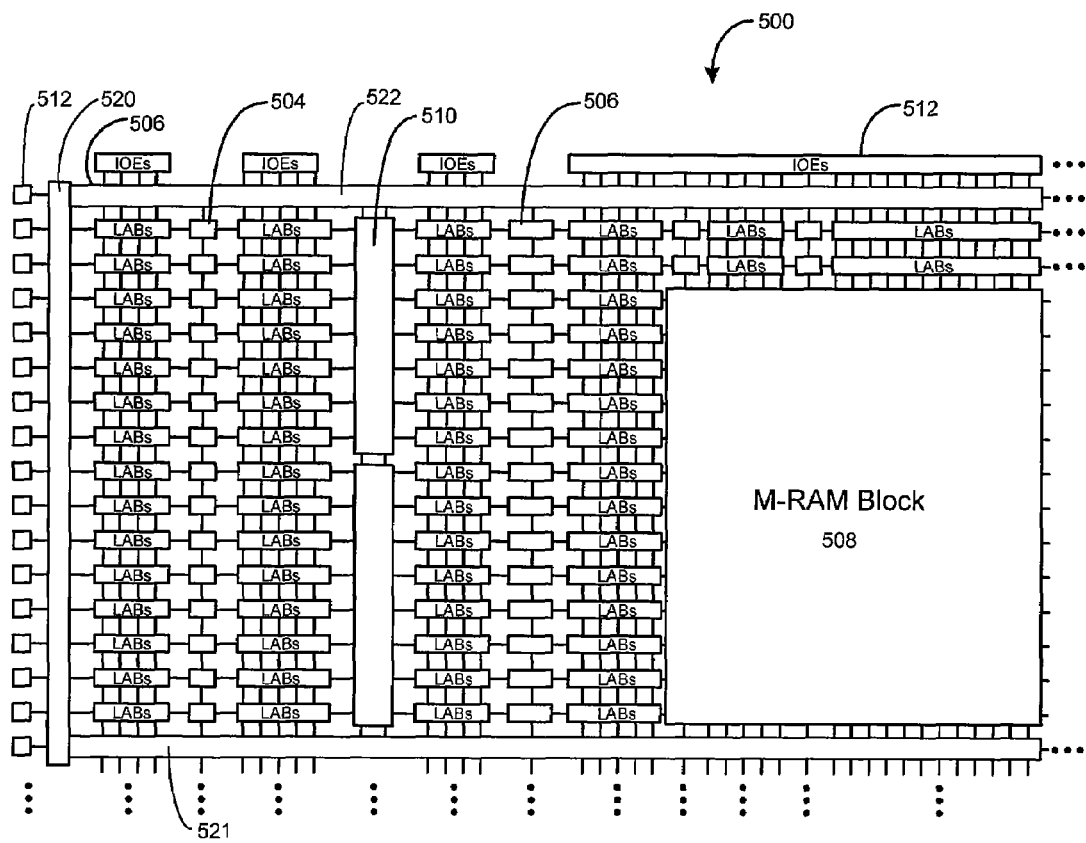
FIG. 5 is a simplified block diagram of another programmable logic device that can be used with the techniques of the present invention.

FIG. 5 is a simplified partial block diagram of a high-density PLD 500. PLD 500 is an example of a programmable integrated circuit with dedicated I/O routing resources of the present invention. PLD 500 includes a two-dimensional array of programmable logic array blocks (or LABs) 502 that are interconnected by a network of column and row interconnects of varying length and speed. LABs 502 each include multiple (e.g., 10) logic elements (or LEs).

An LE is a programmable logic block that provides for efficient implementation of user defined logic functions. A PLD has numerous logic elements that can be configured to implement various combinatorial and sequential functions. The logic elements have access to a programmable interconnect structure. The programmable interconnect structure can be programmed to interconnect the logic elements in almost any desired configuration.

PLD 500 includes vertical and horizontal dedicated I/O conductors including conductors 520, 521, and 522, according to the present invention. I/O elements (IOEs) 512 located, in this example, around the periphery of the device support numerous single-ended and differential I/O standards. Input and output signals can be transmitted quickly to and from I/O elements 512 along the dedicated I/O conductors, bypassing many of the standard local and global conductors.

PLD 500 also includes a distributed memory structure including RAM blocks of varying sizes provided throughout the array. Any of the RAM blocks can be control (CRAM) blocks according to the embodiments of the present invention. The RAM blocks include, for example, 512 bit blocks 504, 4K blocks 506 and a MegaBlock 508 providing 512K bits of RAM. These memory blocks can also include shift registers and FIFO buffers.

PLD 500 further includes digital signal processing (DSP) blocks 510 that can implement, for example, multipliers with add or subtract features. Dedicated I/O conductors 520-522 can transmit signals directly between I/O elements 512 and the DSP or memory blocks, without routing through the global interconnect structure. It is to be understood that PLD 500 is described herein for illustrative purposes only and that the present invention can be implemented in many different types of programmable ICs such as PLDs, FPGAs, and the like.

Figure 6:
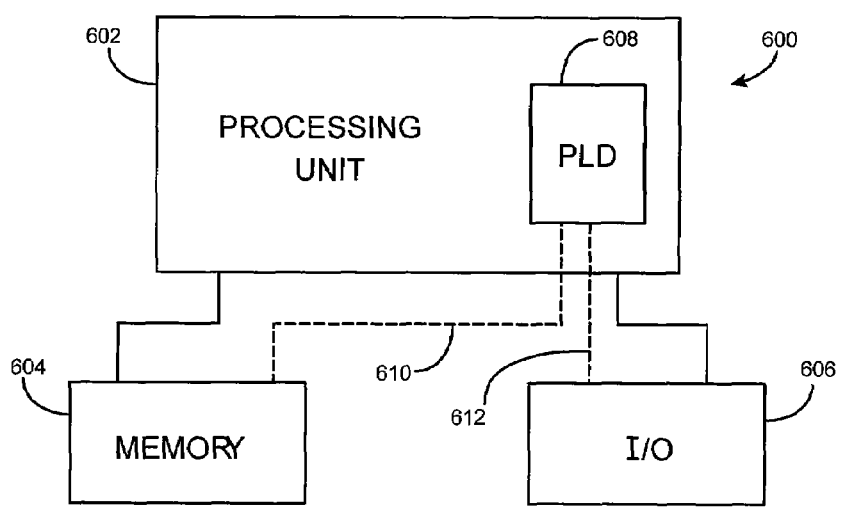
FIG. 6 is a block diagram of an electronic system that can implement embodiments of the present invention.

While PLDs of the type shown in FIG. 5 provide many of the resources required to implement system level solutions, the present invention can also benefit systems wherein a PLD is one of several components. FIG. 6 shows a block diagram of an exemplary digital system 600, within which the present invention can be embodied. System 600 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 600 can be provided on a single board, on multiple boards, or within multiple enclosures.

System 600 includes a processing unit 602, a memory unit 604 and an I/O unit 606 interconnected together by one or more buses. According to this exemplary embodiment, a programmable logic device (PLD) 608 is embedded in processing unit 602. PLD 608 can serve many different purposes within the system in FIG. 6. PLD 608 can, for example, be a logical building block of processing unit 602, supporting its internal and external operations. PLD 608 is programmed to implement the logical functions necessary to carry on its particular role in system operation. PLD 608 can be specially coupled to memory 604 through connection 610 and to I/O unit 606 through connection 612.

Processing unit 602 can direct data to an appropriate system component for processing or storage, execute a program stored in memory 604 or receive and transmit data via I/O unit 606, or other similar function. Processing unit 602 can be a central processing unit (CPU), microprocessor, floating point coprocessor, graphics coprocessor, hardware controller, microcontroller, programmable logic device programmed for use as a controller, network controller, and the like. Furthermore, in many embodiments, there is often no need for a CPU.

For example, instead of a CPU, one or more PLDs 608 can control the logical operations of the system. In an embodiment, PLD 608 acts as a reconfigurable processor, which can be reprogrammed as needed to handle a particular computing task. Alternately, programmable logic device 608 can itself include an embedded microprocessor. Memory unit 604 can be a random access memory (RAM), read only memory (ROM), fixed or flexible disk media, PC Card flash disk memory, tape, or any other storage means, or any combination of these storage means.

While the present invention has been described herein with reference to particular embodiments thereof, a latitude of modification, various changes, and substitutions are intended in the present invention. In some instances, features of the invention can be employed without a corresponding use of other features, without departing from the scope of the invention as set forth. Therefore, many modifications may be made to adapt a particular configuration or method disclosed, without departing from the essential scope and spirit of the present invention. It is intended that the invention not be limited to the particular embodiments disclosed, but that the invention will include all embodiments and equivalents falling within the scope of the claims.

What is claimed is:

1. A programmable logic integrated circuit comprising:
a plurality of I/O pads that allow external access to the integrated circuit;
a plurality of programmable global routing conductors;
a plurality of circuit elements;
programmable dedicated routing conductors coupled to transmit signals between the I/O pads and the circuit elements, bypassing the global routing conductors; and
multiplexers that couple a set of the I/O pads directly to the dedicated routing conductors,
wherein the programmable dedicated routing conductors comprise dedicated horizontal and vertical routing conductors that are programmably connectable to each other by depopulated programmable logic connections.

2. The programmable logic integrated circuit defined in claim 1 wherein a first set of the programmable dedicated routing conductors are programmably coupled to the I/O pads and a second set of the programmable dedicated routing conductors are perpendicular to and programmably coupled to the first set of dedicated routing conductors.

3. The programmable logic integrated circuit defined in claim 2 further comprising cross coupled tristate drivers that couple together first and second portions of the second set of the dedicated routing conductors.

4. The programmable logic integrated circuit defined in claim 1 wherein each of the multiplexers has at least three input terminals coupled to at least three of the I/O pads.

5. The programmable logic integrated circuit according to claim 1 wherein the circuit elements are logic elements that are configurable to implement combinatorial and sequential functions.

6. A method for forming a programmable logic integrated circuit, the method comprising:
providing pads that allow external access to the programmable logic integrated circuit;
providing a plurality of global vertical and horizontal programmable routing conductors;
providing a plurality of circuit elements;
providing programmable dedicated routing conductors that are coupled to transmit signals between the pads and the circuit elements without routing the signals through the global programmable routing conductors, the dedicated routing conductors comprising horizontal and vertical dedicated routing conductors that are programmably connectable to each other by depopulated programmable logic connections; and
providing multiplexers that couple the pads directly to the vertical or the horizontal dedicated routing conductors.

7. The method according to claim 6 wherein each of the multiplexers has at least three input terminals coupled to at least three of the I/O pads.

8. The method according to claim 6 further comprising:
providing a plurality of tristate drivers coupled between the pads and a subset of the dedicated routing conductors.

9. The method according to claim 6 wherein the circuit elements are memory blocks.

10. The method according to claim 6 wherein the circuit elements are logic blocks that are configurable to perform combinatorial and sequential functions.

11. A programmable logic integrated circuit comprising:
global vertical and horizontal routing conductors;
means for providing a plurality of programmable combinatorial and sequential functions;
means for providing external access to the programmable logic integrated circuit; and
means for routing signals between the means for providing external access and the means for providing the plurality of programmable combinatorial and sequential functions without routing through any of the global routing conductors,
wherein the means for routing signals are programmably connectable by depopulated programmable logic connections.

* * * * *